United States Patent [19]

Furumura

[11] Patent Number: 4,509,070
[45] Date of Patent: Apr. 2, 1985

[54] METAL-INSULATOR-SEMICONDUCTOR TRANSISTOR DEVICE

[75] Inventor: Yuji Furumura, Kawasaki, Japan

[73] Assignee: Fujitsu Limited, Kawasaki, Japan

[21] Appl. No.: 218,007

[22] Filed: Dec. 18, 1980

[30] Foreign Application Priority Data

Dec. 27, 1979 [JP] Japan ................. 54-169165

[51] Int. Cl.³ .................................... H01L 27/07
[52] U.S. Cl. ..................... 357/41; 307/584; 357/23.6; 357/23.5
[58] Field of Search .......... 357/23 R, 23 C, 23 VT, 357/41, 46, 59; 307/584

[56] References Cited

U.S. PATENT DOCUMENTS

| 3,702,943 | 11/1972 | Heuner et al. | 357/42 |
| 3,855,581 | 12/1974 | Greene | 307/482 |
| 4,213,140 | 7/1980 | Okabe et al. | 357/23 |
| 4,438,449 | 3/1984 | Usuda | 357/41 |

OTHER PUBLICATIONS

Proceedings of the Sixth International Congress Microelectronics, Nov. 25th-27th, 1974, Oldenbourg Verlag, Munchen (DE), T. Sato et al., "Application of a Layer Structure to Integrated Circuits".
Electronics, Dec. 9, 1976, L. Altman et al., "Several Solid-State Technologies Show Surprising New Paces".

Primary Examiner—James W. Davie
Attorney, Agent, or Firm—Staas & Halsey

[57] ABSTRACT

A metal-insulator-semiconductor (MIS) device comprising a MIS transistor and a MIS input element which are fabricated apart from each other on a semiconductor substrate. The MIS transistor is provided with source and drain regions as well as a channel region between the source and drain regions, a gate insulating layer on the channel region and a gate on the insulating layer. The MIS input element is provided with an input region of the same conductive type as the channel region, an insulating layer on the input region and an electrode on the insulating layer. The electrode and insulating layer of the input element are made of the same material in the same thickness as the gate and insulating layer of the MIS transistor, and the gate of the MIS transistor is exclusively electrically interconnected to the electrode of the MIS input element.

15 Claims, 21 Drawing Figures

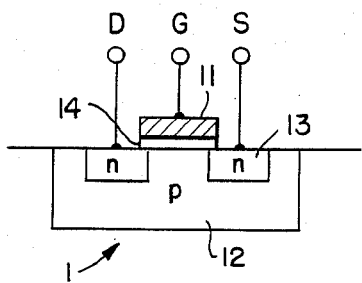
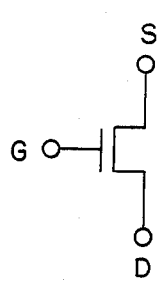
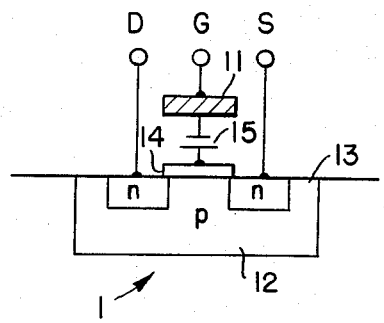
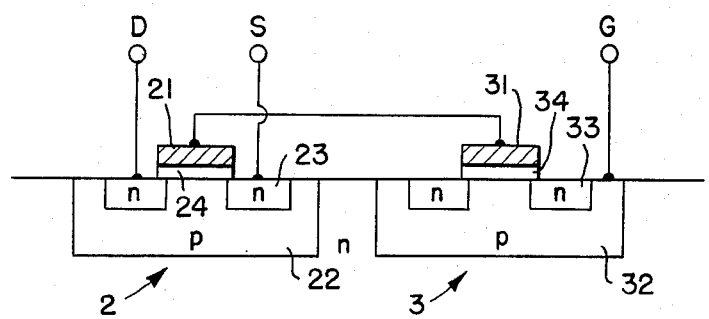
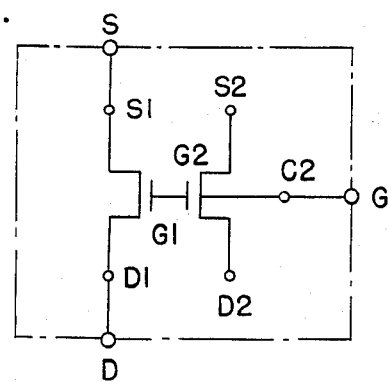
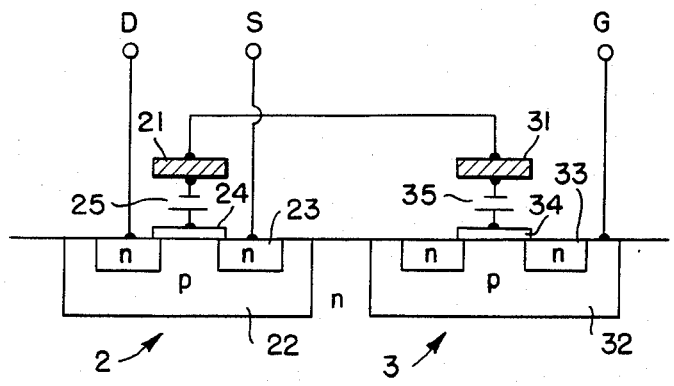

METAL-INSULATOR-SEMICONDUCTOR TRANSISTOR DEVICE

BACKGROUND OF THE INVENTION

This invention is directed to a metal-insulator semiconductor (MIS) transistor device, and more particularly to a MIS semiconductor device comprising two MIS transistors of which the gates are electrically connected to each other, source and drain of one transistor are used as such, and the channel of another transistor as a gate.

A conventional MIS transistor has a structure as shown in FIG. 1A in which two n-type regions or islands 13 are formed in a p-type semiconductor 12, an insulating layer 14 of silicon dioxide (SiO$_2$) is formed across these n-type regions, with a gate 11 fabricated on the insulating layer. These two n-type islands are connected to source (S) and drain (D) terminals, and the gate to the gate terminal (G). The equivalent circuit of the transistor of FIG. 1A is as illustrated in FIG. 1B.

A MIS transistor has a weakness when compared with a bipolar transistor in that the threshold voltage varies or is not uniform from one transistor to the other. It is understood that one primary cause therefor is the difference of characteristics of the phase boundary between silicon and silicon dioxide. Within the substrate of the same crystal, such a difference is due to the fact that the phase boundary is positioned apart. Where there are more than one semiconductor substrates, such a difference is caused by the fact that the substrates are independently processed. For example, alkaline ions (positive ions) of sodium or potassium may enter into the layer of silicon dioxide from outside while the insulating layer is being fabricated in the course of processing the substrate, resulting in the difference of phase boundary characteristics.

Variation or change of the threshold voltage may be understood to be the effect of an imaginary battery 15 existing between gate 11 and SiO$_2$ insulating layer 14 with its negative side connected to the gate as illustrated by an equivalent circuit of FIG. 2, the battery supplying the voltage of which value corresponds to the change of the threshold voltage. The problems encountered in using MIS transistors are that the threshold voltage changes from one lot of MIS transistors to another, and also that it changes as time lapses.

SUMMARY OF THE INVENTION

It is therefore the primary object of this invention to solve the above-described problems experienced with MIS transistors by offering an MIS transistor device in which differences and changes of the threshold voltage due to the differences of material, contaminations and conditions in the manufacturing process are caused to be counterbalanced based on the configuration that any shifts of threshold voltage of two MIS transistors are compensated for by each other by electrically connecting the gates of the two transistors exclusively to each other.

In one embodiment of the invention, a first transistor and a second transistor are provided, the gates of these first and second transistors are electrically connected to each other, the source and drain of the first transistor are used as output regions for providing output signals, and the channel of the second transistor is used as an input region for receiving input signals to drive the device. In other words, an MIS semiconductor device according to the invention thus comprises a MIS transistor and a MIS input element formed on a semiconductor substrate apart from each other, wherein the MIS transistor is provided with source and drain regions or islands and a channel region between these islands, all formed in the same semiconductor substrate, a gate insulating layer and a gate electrode on the gate insulating layer, with the MIS input element having an input region of the same conductive type as the channel region, an insulating layer formed on the input region simultaneously with the formation of the gate insulating layer and consisting of the same material, and an electrode formed on the insulating layer of MIS input element and consisting of the same material as the gate electrode, the gate electrode of MIS transistor and the electrode of MIS input element are electrically and exclusively interconnected, and a voltage is applied from the input region to drive the MIS transistor.

The above and further objects and novel features of the invention will appear more fully from the following detailed description when read in connection with the accompanying drawings. It is to be expressly understood, however, that the drawings are not intended as a definition of the invention but are for the purpose of illustration only.

BRIEF DESCRIPTION OF THE DRAWINGS

In the drawings wherein like parts are marked alike:

FIG. 1A is a cross-sectional view of the structure of a conventional MIS transistor, FIG. 1B is an equivalent circuit diagram of the transistor of FIG. 1A, FIG. 2 is a cross-sectional view to illustrate the difference or change of threshold voltage of the transistor of FIG. 1A, FIG. 3 is a cross-sectional view of the structure of a MIS transistor device according to one embodiment of the invention, FIG. 4 is an equivalent circuit diagram of the device of FIG. 3, FIG. 5 is a view similar to that of FIG. 2 of the device of FIG. 3, FIGS. 6A to 6I are cross-sectional views to illustrate the steps to make the device of FIG. 3, FIGS. 7A, 7B and 7C are plan views of part of the structure of FIG. 3, and FIGS. 8, 9 and 10 are cross-sectional views illustrating other embodiments of the invention.

DESCRIPTION OF THE PREFERRED EMBODIMENTS

Figure 6A:
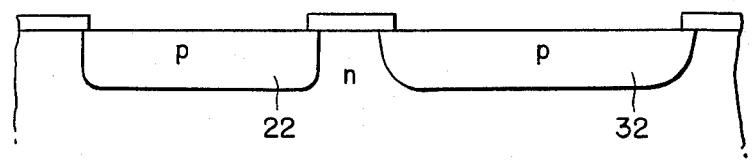

Referring to FIG. 3, an embodiment of the invention will be described. Two p-type channel regions or wells 22, 32 are formed in an n-type silicon semiconductor, and within each p-type well, two n-type regions or islands 23, 33 are formed. Insulating layers 24, 34 of SiO$_2$ are formed on the channel region between the two n-type islands in each p-type well, and gates 21, 31 are fabricated on the insulating layers. The processes described so far are similar to those for fabricating two conventional MIS transistors in one semiconductor substrate. In the description to follow, these transistors will be referred to as the first transistor 2 and the second transistor 3, or MIS transistor and MIS input element.

Gate 21 of the first transistor 2 is electrically connected, as will be described later, only to gate 31 of the second transistor 3, and a lead connects the channel portion 32 of the second transistor 3 to an input terminal G. Source and drain terminals D and S for providing output signals are formed in like manner by leads from the two n-type islands of the first transistor 2. Such a structure is illustrated by the circuit diagram of FIG. 4 in which G1, G2; S1, S2; D1, D2; C2 show respectively the gate, source, drain and channel of each transistor, and this structure functions as an ordinary MIS transistor with terminals G, S and D used as the gate, source and drain of the MIS transistor device, respectively. Since an input signal applied to the terminal G induces a voltage on the gates 21 and 31 due to a capacitive coupling between the input region 32 and the gate 31, the first transistor can be driven by the input signal to provide an output signal on the output terminals D and S. Therefore, the gate electrode 21 is exclusively connected to the electrode 31 and does not have any other electrical connection so that the MIS transistor is responsive only to the input signal.

For the purpose of explaining the FIG. 3 embodiment, reference will be made to FIG. 5 as was done with respect to FIGS. 1 and 2. It is conceived in FIG. 5, in the same manner as with FIG. 2, that there is positioned an imaginary battery between the gate and insulating layer of $SiO_2$. Then, in a circuit starting from gate G to the insulating layer 24 of the first transistor 2, two imaginary batteries 25, 35 are connected in such a manner that their polarities are opposite to each other, and thus their electromotive forces are compensated. Preferably, the first transistor 2 and the second transistor 3 are positioned very close to each other, so that it may be assumed the quality of the material and the manufacturing processes of each transistor are essentially the same. And thus, imaginary batteries 25 and 35 have practically the same electromotive force, and an almost perfect compensation of the electromotive forces can be expected. Consequently, in the embodiment of the invention just described, a difference or change of the threshold voltage due to the difference in the material of the MIS transistor or the difference of conditions in the manufacturing process or contaminations can be set off.

The embodiment of FIG. 3 has been described as an n-channel MIS transistor, but the working principle is the same with respect to a p-channel MIS transistor. It was explained that the second transistor is the same as the first transistor, but essential elements in the second transistor are the channel portion, the gate insulating layer and gate. Thus, those parts of the n-type semiconductor to which the source and drain terminals are connected may be omitted partly or wholly.

Reference will now be made to FIGS. 6A to 6I to describe the steps of manufacturing the MIS transistor device according to the invention. It is to be understood that the manufacturing processes are conventional and are not claimed as such.

Figure 6B:
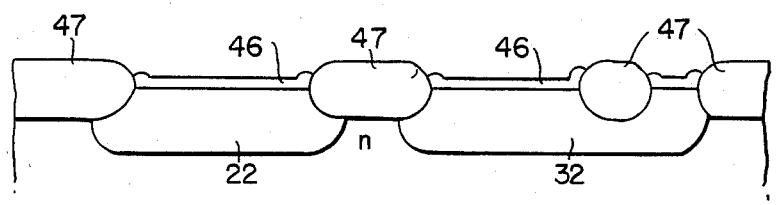
Figure 6C:
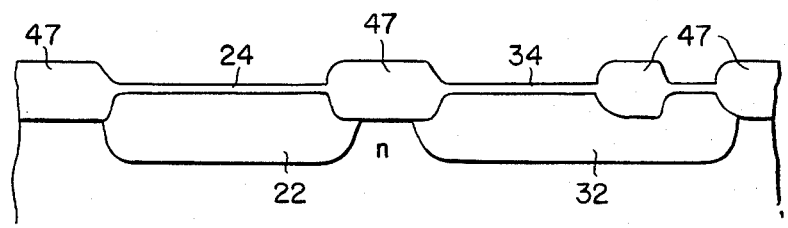
Figure 6D:
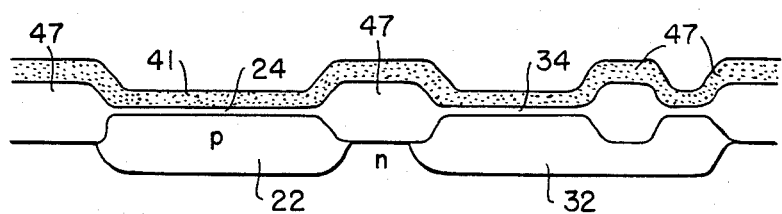
Figure 6E:
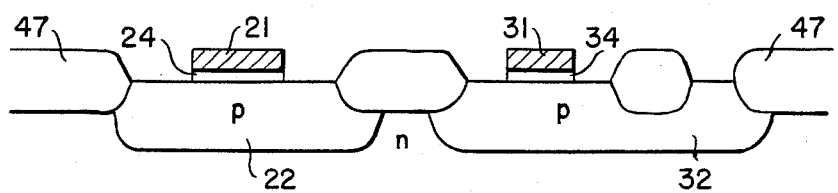
Figure 6F:
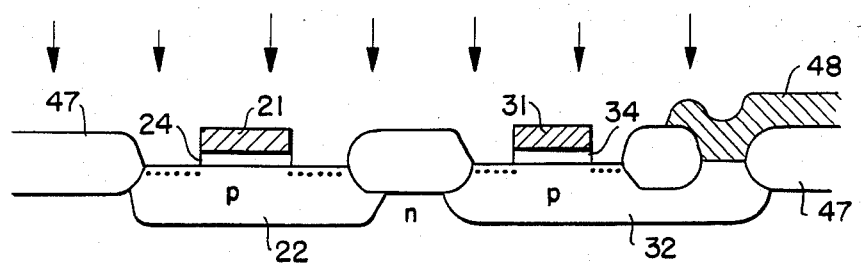
Figure 6G:
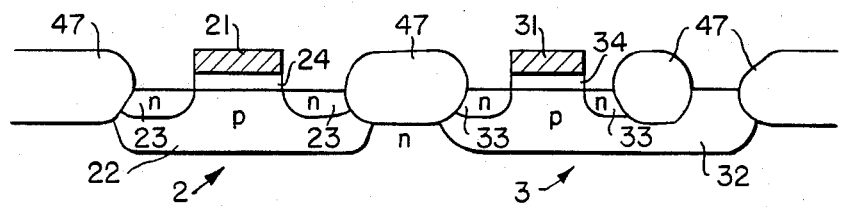
Figure 6H:
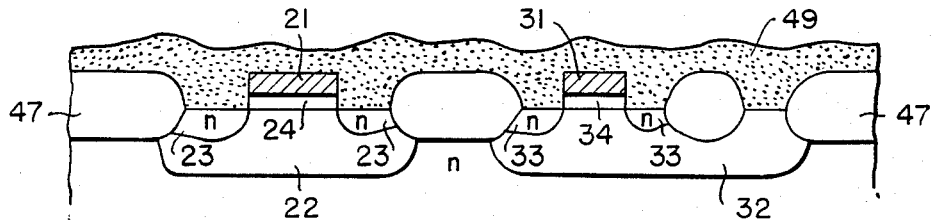
Figure 6I:
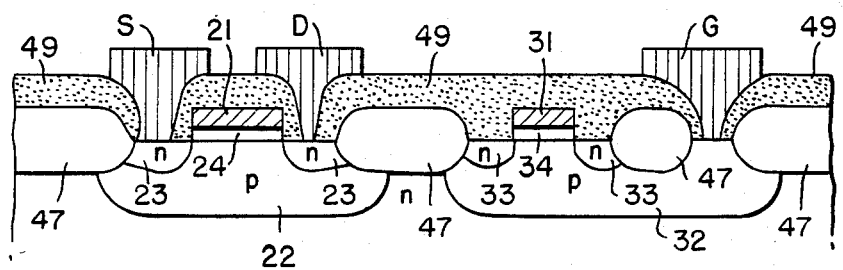

First, p-type wells 22, 32 are formed by diffusion of boron, for example, followed by heat treatment to drive boron into the n-type silicon substrate (FIG. 6A). Next, using a layer 46 of $SiO_2$ or $Si_3N_4$, selective field oxidation is carried out to form oxide layers 47 (FIG. 6B). Gate oxidation follows to form layers 24, 34 of $SiO_2$ (FIG. 6C). A layer 41 of polycrystal silicon is grown on the entire surface of the substrate (FIG. 6D). Patterning of $SiO_2$ layer and polycrystal silicon layer is effected to form insulating layers 24, 34 of $SiO_2$ and gates 21, 31 (FIG. 6E). Photoresist mask 48 is formed as shown in FIG. 6F to prepare for ion implantation of arsenic, for example. This ion implantation is followed by annealing to activate arsenic ions in the substrate for forming n-type islands 23, 33 in p-wells 22, 32 (FIG. 6G). Thereafter, a layer 49 of insulating material, phospho-silicate glass (PSG), for example, to be interposed as an insulating layer between conductive layers, is formed on the entire surface of the substrate by low pressure chemical vapour deposition (CVD) as shown in FIG. 6H. This PSG layer 49 is patterned for fabrication of electrodes S, D and G of aluminum, for example, by vacuum evaporation (FIG. 6I).

Figure 7A:
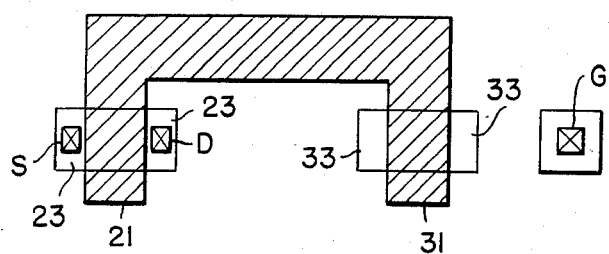
Figure 7B:
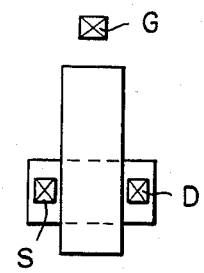
Figure 7C:
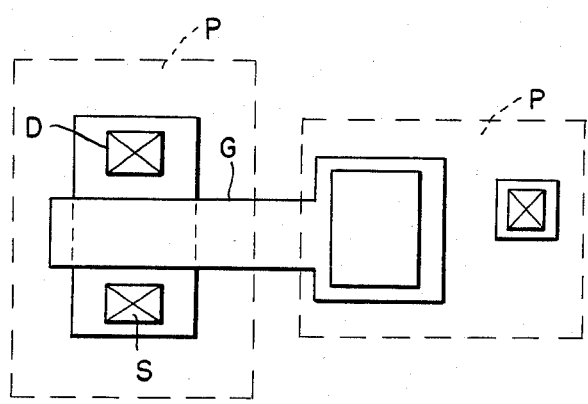

Formation of these electrodes is important because it serves the purpose of electrically connecting two gates 21, 31 which is the characteristic feature of the invention. FIG. 7A is a plan view illustrating the basic mode for connecting gates 21 and 31. Arrangement of FIG. 7A may be modified as shown in FIGS. 7B and 7C. What is important in this connection is that these gates 21 and 31 are electrically connected, and the manner of connection may be varied to meet the requirements of each device.

Figure 8:
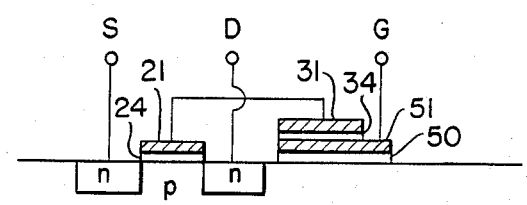

FIG. 8 illustrates another embodiment of the invention in which an electrode 31 to be electrically connected to gate 21 is formed on an insulating layer 34 of the same material and thickness as insulating layer 24. A layer 51 of p-type silicon or polycrystal silicon having the same property as p-type silicon substrate is formed on an insulating layer 50 of thermally grown $SiO_2$ or deposition of $Si_3N_4$ on the substrate, and is connected only to gate terminal G. What is important in this embodiment is that insulating layers 24, 34 as well as the gate 21 and electrode 31 are made of the same material and have the same thickness. It is preferable that the surface areas of gate 21 and electrode 31 are comparable, but it is not critical that they are exactly the same.

Figure 9:
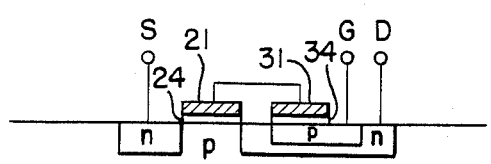

A further embodiment of the invention is illustrated in FIG. 9 in which insulating layers 24, 34 as well as electrodes 21, 31 are made of the same material in the same thickness. In this embodiment, two n-type regions are doped alike. A p-type region in the n-type region is preferably so doped that its Fermi level is substantially equal to that of the p-type substrate. This embodiment cannot be used in such a manner that $V_G$ exceeds $V_D$.

Figure 10:
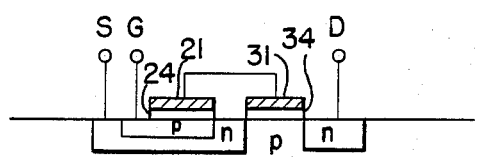

An embodiment of the invention shown in FIG. 10 is basically of the same structure as the embodiment shown in FIG. 9, but is functionally different. The requirements in this embodiment are the same as those in FIG. 9 embodiment, but in using this embodiment, $V_G$ should not exceed $V_S$.

As has been explained, unevenness and change of threshold voltage of MIS transistors due to differences of the material or the manufacturing process or contaminations may be properly compensated in an MIS transistor device according to the invention. And thus, all MIS transistors in one lot have uniform or even threshold voltage, and the threshold voltage will not change despite the lapse of time.

Thus, the invention having been described in its best embodiment and mode of operation, that which is desired to be protected by Letters Patent, and what is claimed is:

1. A metal-insulator-semiconductor device comprising: a semiconductor substrate and a MIS transistor and a MIS input element separately formed in combiantion with the semiconductor substrate;

said MIS transistor comprising a source region and a drain region, both having a first conductivity type, a channel region between said source and drain regions and having a second conductivity type opposite said first conductivity type, a gate insulating layer on said channel region and a gate electrode on said gate insulating layer, said source region, drain region and channel region all being formed in said semiconductor substrate;

said MIS input element comprising an input region of said second conductivity type, an insulating layer formed on said input region and an electrode formed on said insulating layer of said MIS input element, the insulating layer and electrode of said MIS input element respectively consisting of the same materials as those of said gate insulating layer and gate electrode of said MIS transistor;

wherein said gate electrode of said MIS transistor and said electrode of said MIS input element are electrically interconnected; and means connected to said input region for receiving an input signal to drive said MIS transistor.

2. A metal-insulator-semiconductor device comprising: a semiconductor substrate of a first conductivity type and a MIS transistor and a MIS input element separately formed in combination with the semiconductor substrate;

said MIS transistor comprising a channel region of a second conductivity type opposite to said first conductivity type formed in said substrate, source and drain regions of said first conductivity type formed in said channel region, a gate insulating layer formed on said channel region between said source and drain regions, and a gate electrode formed on said gate insulating layer;

said MIS input element comprising an input region of said second conductivity type formed in said substrate, an insulating layer consisting of the same material as said gate insulating layer and formed on said input region, an electrode consisting of the same material as said gate electrode and formed on said insulating layer, said gate electrode of said MIS transistor being exclusively connected to said electrode of said MIS input element; and means connected to said input region for applying an input signal to drive said MIS transistor.

3. A metal-insulator-semiconductor device comprising: a semiconductor substrate of a first conductivity type and a MIS transistor and a MIS input element separately formed in combination with the semiconductor substrate;

said MIS transistor comprising source and drain regions of a second conductivity type opposite to said first conductivity type formed in said substrate, a gate insulating layer formed on said substrate between said source and drain regions, and a gate electrode formed on said gate insulating layer, said MIS input element comprising a first insulating layer formed on said substrate, a semiconductor layer of said first conductivity type formed on said first insulating layer, a second insulating layer formed on said semiconductor layer and consisting of the same material as said gate insulating layer, an electrode formed on said second insulating layer and consisting of the same material as said gate electrode, said gate electrode of said MIS transistor being exclusively connected to said electrode of said MIS input element, and means connected to said semiconductor layer for applying an input signal to drive said MIS transistor.

4. A metal-insulator-semiconductor device comprising: a semiconductor substrate of a first conductivity type and a MIS transistor and a MIS input element formed in combination with the semiconductor substrate, said MIS transistor comprising source and drain regions of a second conductivity type opposite to said first conductivity type formed in said substrate, a gate insulating layer formed on said substrate between said source and drain regions, and a gate electrode formed on said gate insulating layer;

said MIS input element comprising an input region of said second conductivity type formed in one of said source and drain regions of said MIS transistor, an insulating layer formed on said input region and consisting of the same material as said gate insulating layer, an electrode formed on said insulating layer and consisting of the same material as said gate electrode, said gate electrode of said MIS transistor being exclusively connected to said electrode of said MIS input element; and means connected to said input region for applying an input signal to drive said MIS transistor.

5. The device of claim 1, 2 or 4, wherein said gate insulating layer and said insulating layer are composed of silicon dioxide.

6. The device as claimed in claim 3, wherein said gate insulating layer and said first and second insulating layers are composed of silicon dioxide.

7. The device of claim 1, 2 or 4, wherein said gate insulating layer and said insulating layer are composed of $Si_3N_4$.

8. The device as claimed in claim 3, wherein said gate insulating layer and said first and second insulating layers are composed of $Si_3N_4$.

9. The device as claimed in claim 1, 2 or 4, wherein the thickness of said gate insulating layer is approximately equal to that of said insulating layer, and the thickness of said gate electrode is approximately equal to that of said electrode.

10. The device as claimed in claim 1, 2 or 4, wherein the thickness of said gate insulating layer is approximately equal to that of said MIS input element insulating layer, and the thickness of said gate electrode is approximately equal to that of said electrode.

11. The device as claimed in claim 1, 2, 3 or 4, wherein the area of said gate electrode is approximately equal to that of said electrode.

12. The device as claimed in claim 1, 2, 3 or 4, wherein said drain region and said source region are n-type.

13. The device as claimed in claim 1, 2, 3 or 4, wherein said drain region and said source region are p-type.

14. The device as claimed in claim 4, wherein said input region is formed in said source region, said source region having a specific potential applied to it, and said input signal to said input region being less than said potential on said source region.

15. The device as claimed in claim 4, wherein said input region is formed in said drain region, said drain region having a potential applied to it, and said input signal to said input region being less than said potential applied to said drain region.

* * * * *